US009153406B2

(12) United States Patent
Sato

(10) Patent No.: US 9,153,406 B2
(45) Date of Patent: Oct. 6, 2015

(54) SUPPORTING STRUCTURE AND ION GENERATOR USING THE SAME

(71) Applicant: SEN Corporation, Tokyo (JP)

(72) Inventor: Masateru Sato, Ehime (JP)

(73) Assignee: SEN CORPORATION, Tokyo (JP)

( * ) Notice: Subject to any disclaimer, the term of this patent is extended or adjusted under 35 U.S.C. 154(b) by 0 days.

(21) Appl. No.: 14/582,696

(22) Filed: Dec. 24, 2014

(65) Prior Publication Data

US 2015/0179385 A1    Jun. 25, 2015

(30) Foreign Application Priority Data

Dec. 25, 2013   (JP) .................................. 2013-267764

(51) Int. Cl.
*H01J 27/02*    (2006.01)
*H01J 27/08*    (2006.01)
*H01J 37/08*    (2006.01)

(52) U.S. Cl.
CPC .............. *H01J 27/08* (2013.01); *H01J 27/022* (2013.01)

(58) Field of Classification Search
USPC .................. 250/423 R, 423 F, 424, 426, 427, 250/492.21, 493.1; 313/360.1, 361.1, 313/362.1, 363.1, 441, 448, 451, 456, 313/231.01, 231.21, 231.31, 231.41, 313/231.71; 315/111.01–111.91; 378/136, 378/138
See application file for complete search history.

(56) References Cited

U.S. PATENT DOCUMENTS

| 5,497,006 | A | 3/1996 | Sferlazzo et al. | |
| 7,138,768 | B2* | 11/2006 | Maciejowski et al. | ... 315/111.81 |
| 7,679,070 | B2* | 3/2010 | Chen | ......... 250/492.21 |
| 2003/0218428 | A1* | 11/2003 | Maciejowski et al. | ... 315/111.81 |
| 2009/0008570 | A1* | 1/2009 | Chen | .............................. 250/426 |
| 2013/0249400 | A1* | 9/2013 | Sato | ......... 315/111.81 |
| 2015/0129775 | A1* | 5/2015 | Sato | .................................... 27/8 |

FOREIGN PATENT DOCUMENTS

| JP | H08-227688 A | 9/1996 |
| JP | 2000-331620 A | 11/2000 |
| JP | 2005-527952 A | 9/2005 |
| WO | WO-03/100806 A1 | 12/2003 |

* cited by examiner

*Primary Examiner* — Bernard E Souw

(74) *Attorney, Agent, or Firm* — Michael Best & Friedrich LLP

(57) ABSTRACT

An ion generator includes: an arc chamber; a repeller that includes a repeller plate provided within the arc chamber and a repeller extension portion inserted through a through hole communicating the inside and the outside of the arc chamber; and a supporting structure that is provided outside the arc chamber and that supports the repeller so that a gap is ensured between the repeller extension portion and an inner wall of the through hole. The supporting structure includes a cover member that forms, outside the arc chamber, a small chamber communicating with the gap, and an insulation member that electrically insulates the arc chamber and the repeller from each other.

8 Claims, 6 Drawing Sheets

SUPPORTING STRUCTURE AND ION GENERATOR USING THE SAME

BACKGROUND OF THE INVENTION

1. Field of the Invention

The present invention relates to a supporting structure for a repeller and to an ion generator using the supporting structure.

2. Description of the Related Art

In a semiconductor manufacturing process, a process of implanting ions into a semiconductor wafer has been implemented on a standard basis for the purpose of changing conductivity, for the purpose of changing a crystal structure of the semiconductor wafer, and for some other purpose. An apparatus used in this process is generally called an ion implanter.

As an ion source in such an ion implanter, a direct current (DC)-discharge type ion source is known. A DC-discharge type ion source heats a filament by a current to generate thermal electrons, which then heat a cathode. Thereafter, thermal electrons generated by the heated cathode are accelerated by a DC voltage within an arc chamber and collided with source gas molecules therein, so that atoms included in the source gas molecules are ionized.

At a position opposite to the cathode in the arc chamber is provided a repeller that repels electrons accelerated within the arc chamber. The repeller is electrically insulated from the arc chamber, so as to have the function to repel electrons, improving the ionization efficiency within the arc chamber. The repeller is installed via an insulation member provided within the arc chamber, for example.

For the source gas molecules to be introduced into the arc chamber, a halide such as a fluoride or a chloride is often used. The source gas molecules of a halide generate halogen radicals in an ionization step, and the halogen radicals act on a component constituting the ion source, such as a metal material for an inner wall of the arc chamber, to form a chemical bond. The chemically-bonded metal material is then ionized with the source gas molecules and deposited as an ionized substance on the inner wall of the arc chamber or the like, which may form a conductive film.

When a metal material is deposited on the insulation member of the repeller as the ion source is used and when a conductive film is then formed, the insulation properties of the repeller are degraded. When the insulation properties are degraded, the repeller's function to repel electrons is significantly degraded, so that the generation efficiency of ions is lowered and the life of the ion source is shortened. As a result, the components with degraded insulation properties are replaced more frequently, causing deterioration of productivity in the process using the ion implanter.

SUMMARY OF THE INVENTION

The present invention has been made in view of such a situation, and a purpose thereof is to provide a supporting structure for a repeller by which degradation of the insulation property of the repeller can be reduced and to also provide an ion generator using the supporting structure.

To solve the problem above, an ion generator of an embodiment of the present invention includes: an arc chamber; a repeller that includes a repeller plate provided within the arc chamber and a repeller extension portion inserted through a through hole communicating the inside and the outside of the arc chamber; and a supporting structure that is provided outside the arc chamber and that supports the repeller so that a gap is ensured between the repeller extension portion and an inner wall of the through hole. The supporting structure includes a cover member that forms, outside the arc chamber, a small chamber communicating with the gap, and an insulation member that electrically insulates the arc chamber and the repeller from each other.

Another embodiment of the present invention is a supporting structure. The supporting structure supports a base of a repeller inserted through a through hole communicating the inside and the outside of an arc chamber so that a gap is ensured between the base and an inner wall of the through hole. The supporting structure includes a cover member that forms, outside the arc chamber, a small chamber communicating with the gap, and an insulation member that electrically insulates the arc chamber and the repeller from each other.

Optional combinations of the aforementioned constituting elements, and implementations of the present invention in the form of methods, apparatuses, or systems may also be practiced as additional modes of the present invention.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described by reference to the preferred embodiments. This does not intend to limit the scope of the present invention, but to exemplify the invention.

Hereinafter, a mode for carrying out the present invention will be described in detail with reference to the drawings. It is to be noted that the same element is provided with the same numeral in descriptions of the drawings, and a repeated description is omitted as appropriate. Further, a configuration described below is illustrative and is not to restrict the scope of the present invention.

Figure 1:
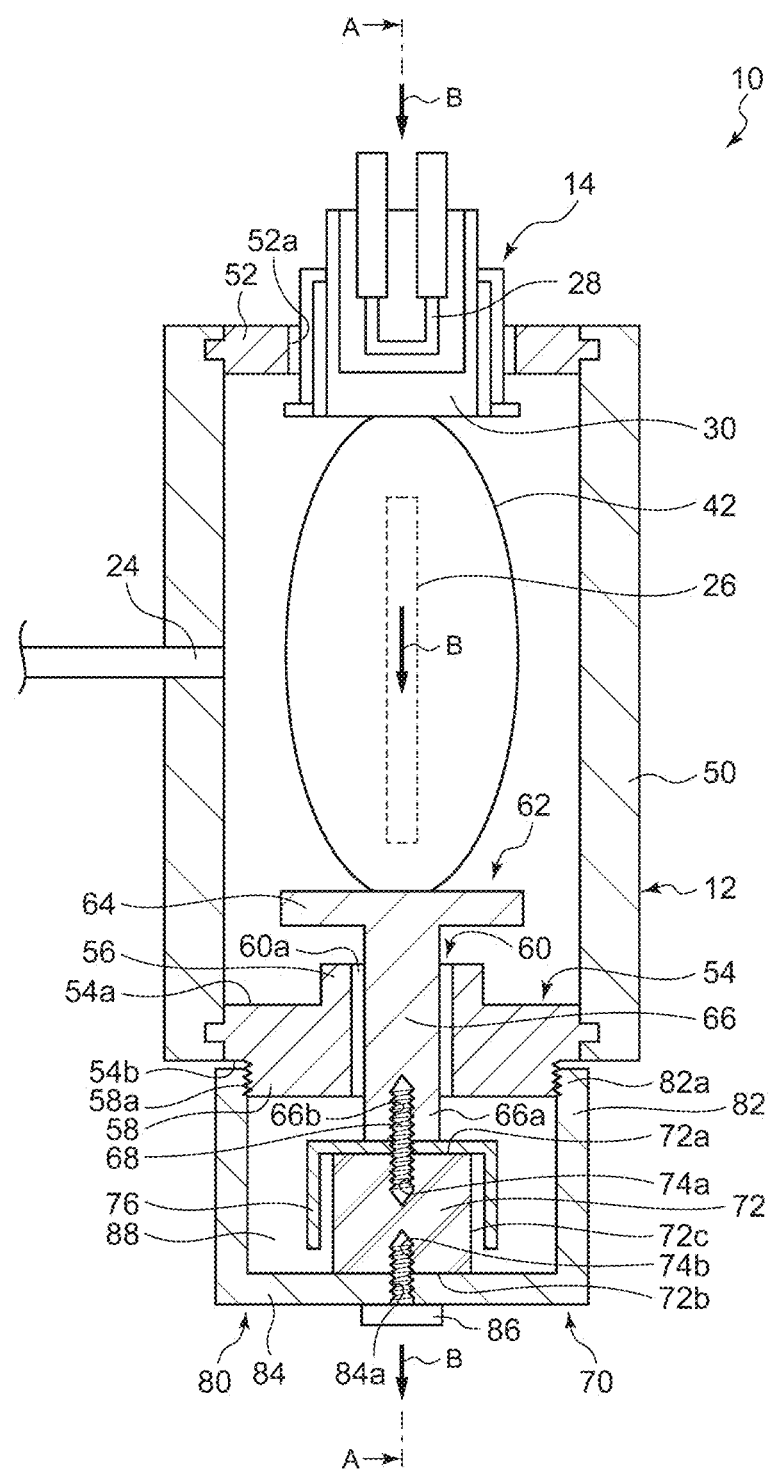
FIG. 1 is a schematic diagram that shows an arc chamber and a supporting structure for a repeller in an ion generator according to the present embodiment.
Figure 2:
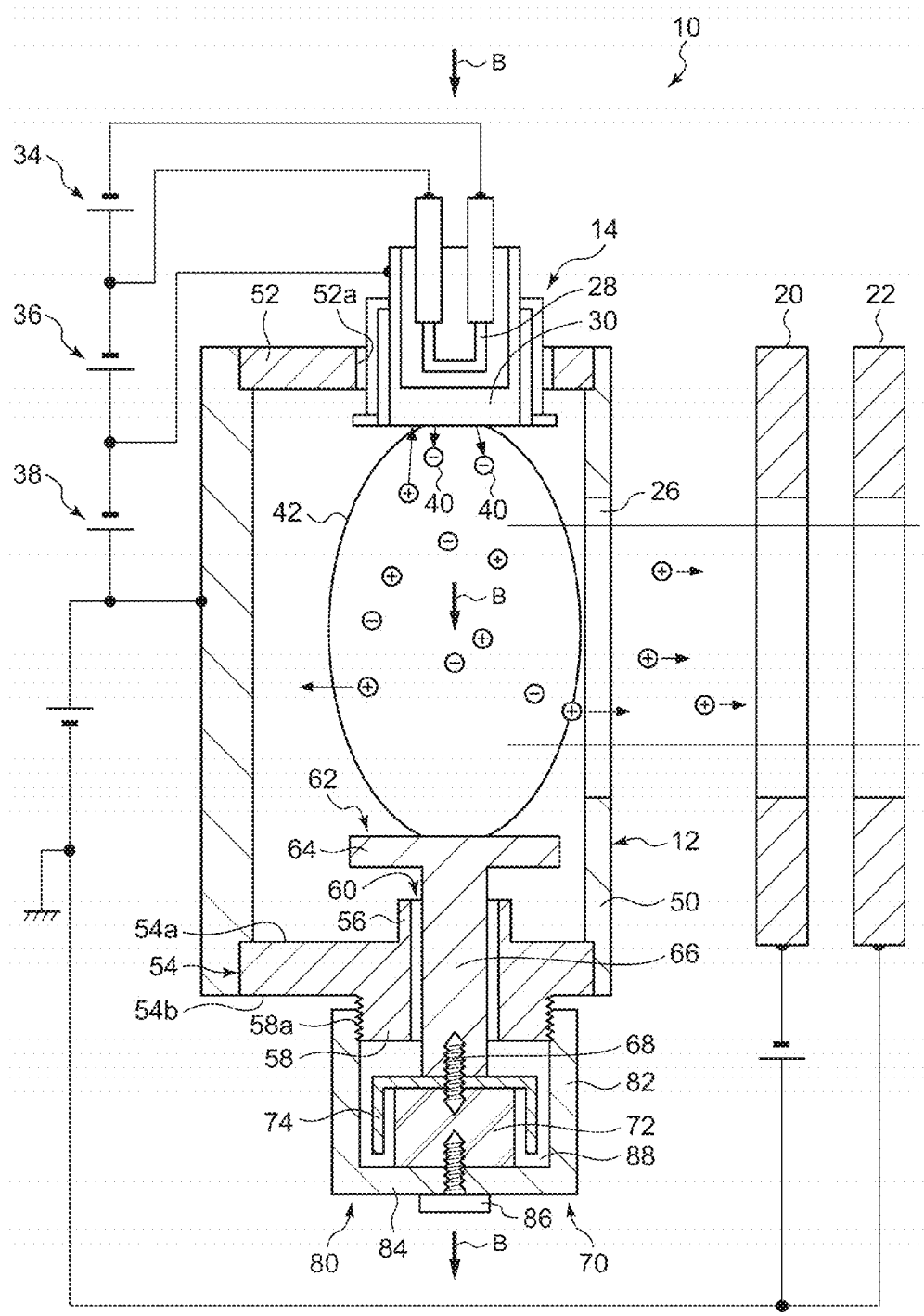
FIG. 2 is a schematic diagram that shows a section of the ion generator shown in FIG. 1 taken along line A-A.

FIG. 1 is a schematic diagram that shows an arc chamber 12 and a supporting structure 70 for a repeller 62 in an ion generator 10 according to the present embodiment. FIG. 2 is a schematic diagram that shows a section of the ion generator 10 shown in FIG. 1 taken along line A-A.

An ion generator 10 according to the present embodiment is a DC-discharge type system and comprises an arc chamber 12, a thermal electron emitter 14, a repeller 62, a supporting structure 70, a suppression electrode 20, a ground electrode 22, and a variety of power supplies.

The arc chamber 12 has a substantially rectangular parallelepiped shape. The arc chamber 12 is made of a high melting point material, such as a high melting point metal, including tungsten (W), molybdenum (Mo), and tantalum (Ta), an alloy of those, graphite (C), or the like. Therefore, even in an environment where the temperature in the arc chamber becomes relatively high, the arc chamber would be hard to melt.

The arc chamber 12 includes side wall plates 50, an upper surface plate 52, and a lower surface plate 54. On the side wall plates 50 are formed a gas introducing port 24 that introduces a source gas, and a front slit 26 that is an opening through which an ion beam is extracted. Also, on the upper surface plate 52 is provided the thermal electron emitter 14, and the lower surface plate 54 has a through hole 60 through which the repeller 62 is inserted.

In the following description, the direction from the upper surface plate 52 toward the lower surface plate 54 may be referred to as an axial direction. Also, between the directions along the axial direction, the direction from the lower surface plate 54 toward the upper surface plate 52 is also referred to as the upward direction or upside, and the direction from the upper surface plate 52 toward the lower surface plate 54 is also referred to as the downward direction or downside. Further, the internal part of the arc chamber 12 is also referred to as the inside, and the external part of the arc chamber 12 is also referred to as the outside.

The lower surface plate 54 has the through hole 60 that communicates the inside and the outside of the arc chamber 12 and extends along the axial direction. A cross section of the through hole 60 perpendicular to the axial direction has a circular shape. At the outlet of the through hole 60 on the inside of the arc chamber 12, a protrusion portion 56 that protrudes in the upward direction from an inner surface 54a is provided. At the outlet of the through hole 60 on the outside of the arc chamber 12, on the other hand, a connection portion 58 that protrudes in the downward direction from an outer surface 54b is provided. The side surface of the connection portion 58 is subjected to thread cutting so as to form a coaxial screw 58a to which the supporting structure 70 is connected. The coaxial screw 58a has a central axis in common with the through hole 60.

The thermal electron emitter 14, which emits a thermal electron into the arc chamber, includes a filament 28 and a cathode 30. The thermal electron emitter 14 is inserted into an attachment hole 52a in the upper surface plate 52 and fixed so as to be insulated from the arc chamber 12.

The filament 28 is heated by a filament power supply 34 and generates thermal electrons at the tip. The (primary) thermal electrons generated from the filament 28 are accelerated by a positive potential generated by a cathode power supply 36, so as to be collided with the cathode 30, which is heated by the heat generated at the time of the collision. Thereafter, the heated cathode 30 generates (secondary) thermal electrons 40, which are accelerated by an arc voltage applied between the cathode 30 and the arc chamber 12 by an arc power supply 38 and are then emitted into the arc chamber 12 as beam electrons having sufficient energy for ionizing gas molecules.

The repeller 62 includes a repeller plate 64 and a repeller extension portion 66. The repeller plate 64 is provided at a position opposite to the thermal electron emitter 14 so as to face the cathode 30 and to be almost parallel thereto. The repeller plate 64 repels electrons within the arc chamber to keep the electrons at a position where plasma 42 is generated, thereby improving the generation efficiency of ions.

The repeller extension portion 66 is a member having a cylindrical shape extending almost perpendicularly to the repeller plate 64 and serves as the base of the repeller 62. The repeller extension portion 66 is inserted through the through hole 60 in the lower surface plate 54 and attached to the supporting structure 70 provided outside the arc chamber. At an end portion 66a of the repeller extension portion 66, a screw hole 66b that is coaxial with the central axis of the through hole 60 is provided, and the repeller extension portion 66 is fixed to an insulation member 72 by a connection screw 68. Accordingly, the repeller extension portion 66 is fixed so that a gap 60a is ensured between the repeller extension portion 66 and the inner wall of the through hole 60, and the repeller 62 is electrically insulated from the arc chamber 12.

The supporting structure 70 includes the insulation member 72, a shield member 76, and a cover member 80. The supporting structure 70 is provided outside the arc chamber 12 so that a small chamber 88 communicating with the gap 60a in the through hole 60 is formed outside the arc chamber 12. Within the small chamber 88, the insulation member 72 connected to the repeller 62 is provided. Accordingly, the supporting structure 70 supports the repeller 62 while the insulation between the arc chamber 12 and the repeller 62 is ensured.

The cover member 80 has a side wall 82 of cylindrical shape and a bottom wall 84 attached thereto, forming a cup shape. The side wall 82 has an open end 82a of which the inner surface is subjected to thread cutting, and, as the coaxial screw 58a of the lower surface plate 54 is screwed thereonto, the cover member 80 is fixed to the outside of the lower surface plate 54. Thus, the cover member 80 and the lower surface plate 54 form the small chamber 88. The small chamber 88 is hermetically closed outside the arc chamber 12 but communicates with the inside of the arc chamber 12 via the gap 60a in the through hole 60.

On the bottom wall 84 of the cover member 80 is provided a screw hole 84a through which a set screw 86 is inserted. The screw hole 84a is formed to be coaxial with the central axis of the through hole 60. Accordingly, the insulation member 72 provided within the cover member 80 is fixed onto the central axis of the through hole 60.

Since the cover member 80 is connected to the arc chamber 12 of which the temperature becomes high, the cover member 80 is also preferably made of a high melting point material. For example, the cover member 80 may be made of a high melting point metal, including tungsten (W), molybdenum (Mo), and tantalum (Ta), an alloy of those, graphite (C), or the like.

The insulation member 72 is a member used to connect the cover member 80 and the repeller 62. The insulation member 72 is housed within the cover member 80 and has a cylindrical shape corresponding to the shape of the cover member 80. The insulation member 72 may have another shape that can be housed within the cover member 80, such as a column shape of which an upper surface 72a and a lower surface 72b are polygons, including a prism. The insulation member 72 is made of a ceramic material, such as alumina ($Al_2O_3$).

In the insulation member 72, screw holes 74a and 74b, which are coaxial with each other, are provided on the upper surface 72a and the lower surface 72b, respectively. Into the screw hole 74a on the upper surface 72a is inserted the connection screw 68, so that the repeller extension portion 66 and the insulation member 72 are fixed to each other. Also, into the screw hole 74b on the lower surface 72b is inserted the set screw 86, so that the insulation member 72 and the cover member 80 are fixed to each other.

The shield member 76, having a cup shape, is disposed so as to cover the upper surface 72a and a side surface 72c of the insulation member 72. The shield member 76 is sandwiched and fixed between the upper surface 72a of the insulation member 72 and the end portion 66a of the repeller extension portion 66. The shield member 76 prevents an ionized substance entering the small chamber 88 from attaching to an outer surface, the upper surface 72a or side surface 72c, of the insulation member 72. As with the cover member 80, the shield member 76 may also be made of a high melting point metal, including tungsten (W), molybdenum (Mo), and tantalum (Ta), an alloy of those, graphite (C), or the like.

To the ion generator 10 having the aforementioned configuration is applied an external magnetic field B induced by a source magnetic field coil in the axial direction connecting the cathode 30 and the repeller 62. Also, since the repeller 62 is provided so as to face the cathode 30 that emits beam electrons, the beam electrons reciprocate between the cathode 30 and the repeller 62 along the magnetic field B. The reciprocating beam electrons then collide with and ionize source gas molecules introduced into the arc chamber 12 to generate ions, so as to generate the plasma 42 in the arc chamber 12. Since the beam electrons mostly exist within a range restricted by the applied magnetic field, ions are mainly generated within the range; the ions then reach, by diffusion, the inner wall of the arc chamber 12, the front slit 26, the cathode 30, or the repeller 62 and are lost on the wall surface.

As the source gas, there is used a noble gas, hydrogen ($H_2$), a hydride such as phosphine ($PH_3$) or arsine ($AsH_3$), or a halide including a fluoride such as boron trifluoride ($BF_3$) or germanium tetrafluoride ($GeF_4$) and a chloride such as indium trichloride ($InCl_3$). Such a source gas is introduced into the arc chamber 12 and ionized by the beam electron made of the (secondary) thermal electrons 40. However, when energized ions by the arc voltage are incident on and collided with the inner wall of the arc chamber 12, the cathode 30, or the repeller 62, they cause wear of a constituent material (W, Ta, Mo, graphite, or the like) of each component by sputtering or chemical etching.

Further, in the case where the source gas is a fluoride, e.g., $BF_3$, there may be generated $B^+$, $BF^+$, $BF_2^+$, $F^+$, and $F_2^+$ by ionization and, when such ions are neutralized on a wall surface within the arc chamber 12, highly reactive fluorine radicals, such as F and $F_2$, are generated. A fluorine radical may be chemically bonded with a material of a component constituting the ion generator 10, so as to form a fluoride, such as $WF_x$, $TaF_x$, $MoF_x$, or $CF_x$. Thereafter, such a fluoride is gasified at a relatively low temperature and ionized within the arc chamber 12, so as to reach and attach to the inner wall of the arc chamber 12 or the like as an ionized substance, such as $WF_x^+$, $TaF_x^+$, $MoF_x^+$, or $CF_x^+$, which may form a conductive film.

Such a conductive film may also attach to an insulation component constituting the ion generator 10, causing degradation of the insulation properties. For example, if a conductive film is formed on an outer surface of an insulation member for a repeller, the insulation properties of the repeller will be degraded. When the insulation properties are degraded, the repeller's function to repel electrons is significantly degraded, so that the generation efficiency of ions is lowered and the life of the ion source is shortened. As a result, the component with degraded insulation properties is replaced more frequently, causing large deterioration of productivity in the process using the ion implanter.

In the present embodiment, the insulation member 72 is disposed within the small chamber 88 provided outside the arc chamber 12, instead of being disposed within the arc chamber 12. The small chamber 88 is hermetically closed outside the arc chamber 12 but communicates to the inside of the arc chamber 12 via the gap 60a in the through hole 60; accordingly, the small chamber 88 is filled with the source gas in the same way as the arc chamber 12, and a gas flow is not generated in the gap 60a. Therefore, since an ionized substance caused within the arc chamber 12 is restrained from flowing into the small chamber 88, adhesion of a conductive film is less likely to occur within the small chamber 88 than within the arc chamber 12. Thus, since the insulation member 72 is disposed within the small chamber 88 in the present embodiment, degradation of the insulation properties of the insulation member 72 can be delayed. Accordingly, the ion source can be given a longer life.

Also, in the present embodiment, the outer surfaces of the insulation member 72 are covered by the shield member 76. Accordingly, even if ionized substances flow into the small chamber 88, part of the ionized substances will form a conductive film on a surface of the shield member 76. Namely, providing the shield member 76 prevents an outer surface of the insulation member 72 from being tainted by a conductive film. Therefore, degradation of the insulation properties of the insulation member 72 can be delayed.

In the present embodiment, the insulation member 72 is disposed at a position immediately below the lower surface plate 54 and between the repeller 62 and the cover member 80. Since the temperatures of the repeller 62 and cover member 80 become high when the ion generator 10 is operated, the insulation member 72 positioned between the repeller 62 and cover member 80 is also maintained at a high temperature. In addition, since the insulation member 72 is housed within the small chamber 88, the insulation member 72 tends to be maintained in a high temperature state. When the temperature of the insulation member 72 is high, ionized substances flow into the small chamber 88 are less likely to attach to a surface, thereby reducing the formation of a conductive film. Therefore, degradation of the insulation properties of the insulation member 72 can be delayed.

Further, according to the present embodiment, the components constituting the repeller 62 and the supporting structure 70 are disposed coaxially with respect to the lower surface plate 54. The cover member 80 is fixed by the coaxial screw 58a having a central axis in common with the through hole 60, and the set screw 86 for fixing the insulation member 72 and the connection screw 68 for fixing the repeller 62 are also disposed coaxially therewith. Accordingly, the repeller 62 can be fixed at the center of the through hole 60 with high positional accuracy, so that the gap 60a between the repeller extension portion 66 and the inner wall of the through hole 60 can be favorably maintained. Especially, compared to a comparative example described later with reference to FIG. 3, the situation can be prevented where the repeller extension portion 66 touches the inner wall of the through hole 60 because of a positional displacement of the repeller 62, causing insulation failure.

Figure 3:
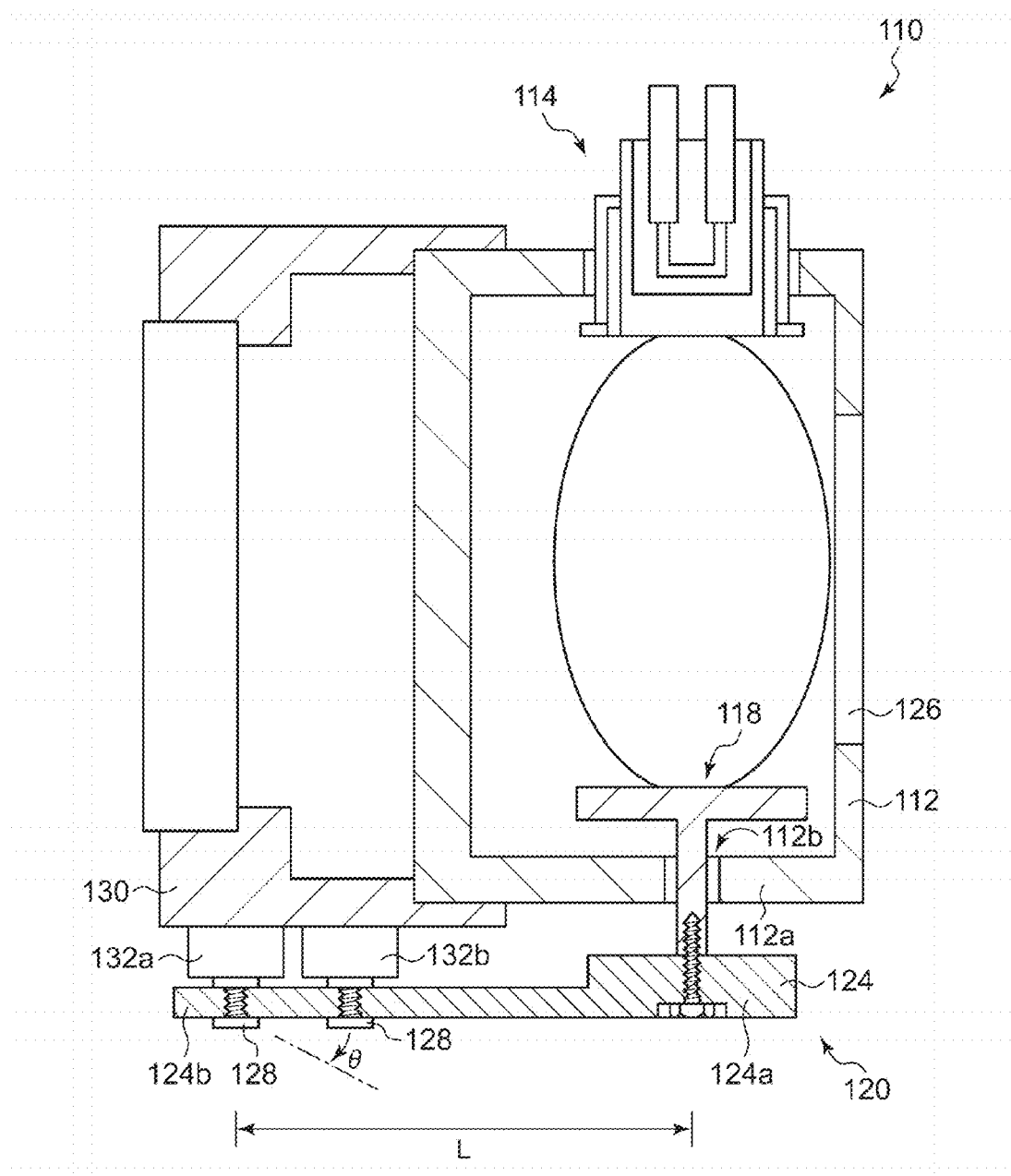
FIG. 3 is a schematic diagram that shows an arc chamber and a supporting structure for a repeller in an ion generator according to a comparative example.

FIG. 3 is a schematic diagram that shows an arc chamber 112 and a supporting structure 120 for a repeller 118 in an ion generator 110 according to a comparative example. As with in the aforementioned embodiment, the ion generator 110 comprises the arc chamber 112, a thermal electron emitter 114, and the repeller 118. The repeller 118 is inserted through a through section 112b provided in a bottom portion 112a of the arc chamber 112 and fixed to the supporting structure 120 provided outside the arc chamber 112.

The supporting structure 120 according to the comparative example includes a repeller supporting plate 124 and insulation members 132a and 132b. The repeller supporting plate 124 extends in a direction intersecting the axial direction of the arc chamber 112 (lateral direction). The repeller supporting plate 124 is connected to the repeller 118 at one end, which is a connection portion 124a, and fixed to a chamber supporting portion 130 via the insulation members 132a and 132b at the other end, which is a fixing portion 124b. In the comparative example, the insulation members 132a and 132b are distanced from the arc chamber 112 by means of the repeller supporting plate 124 extending in a lateral direction so as to prevent the formation of a conductive film caused by an ionized substance attaching to a surface of the insulation members 132.

In the comparative example, in order to ensure the insulation properties of the insulation members 132a and 132b, a distance L is maintained between the connection portion 124a and the fixing portion 124b. Accordingly, if a screw 128 fixing the insulation member 132a or 132b becomes loose and the repeller supporting plate 124 moves in a 0 direction even slightly, the connection portion 124a of the repeller supporting plate 124 will greatly move. Consequently, the repeller 118 will touch the inner wall of the through section 112b, so that it may be unable to ensure the insulation properties of the repeller 118. Thus, in the comparative example, when the repeller supporting plate 124 is lengthened to ensure the insulation properties, the length could cause insulation failure.

Also, even when some measure is implemented to distance the positions of the insulation members 132a and 132b from the arc chamber 112 in the comparative example, there is generated a flow of the source gas from the arc chamber 112 through the through section 112b to the outside, so that ionized substances will flow out. As a result, an ionized substance may attach to a surface of the insulation members 132a and 132b and form a conductive film, causing insulation failure.

In the present embodiment, on the other hand, since the through hole 60, repeller 62, insulation member 72, and cover member 80 are disposed coaxially, the repeller 62 is less likely to shift in position in a direction intersecting the axis, even when the connection portions of such components become loose. Accordingly, the gap 60a between the repeller extension portion 66 and the inner wall of the through hole 60 can be maintained. In addition, by maintaining the gap 60a, the situation can be prevented where a conductive film is formed on the inner wall of the through hole 60 and the gap 60a is filled with a conductive material, causing insulation failure.

Also, in the present embodiment, the protrusion portion 56 that protrudes upward from the inner surface 54a is provided at the outlet of the through hole 60 on the inside of the arc chamber 12. Accordingly, even if a conductive substance deposited on a side wall plate 50 or the upper surface plate 52 of the arc chamber 12 peels off and falls to the lower surface plate 54, such a conductive substance will hardly enter the through hole 60. Thus, providing the protrusion portion 56 can restrain the degradation of the insulation properties of the repeller 62.

Figure 4:
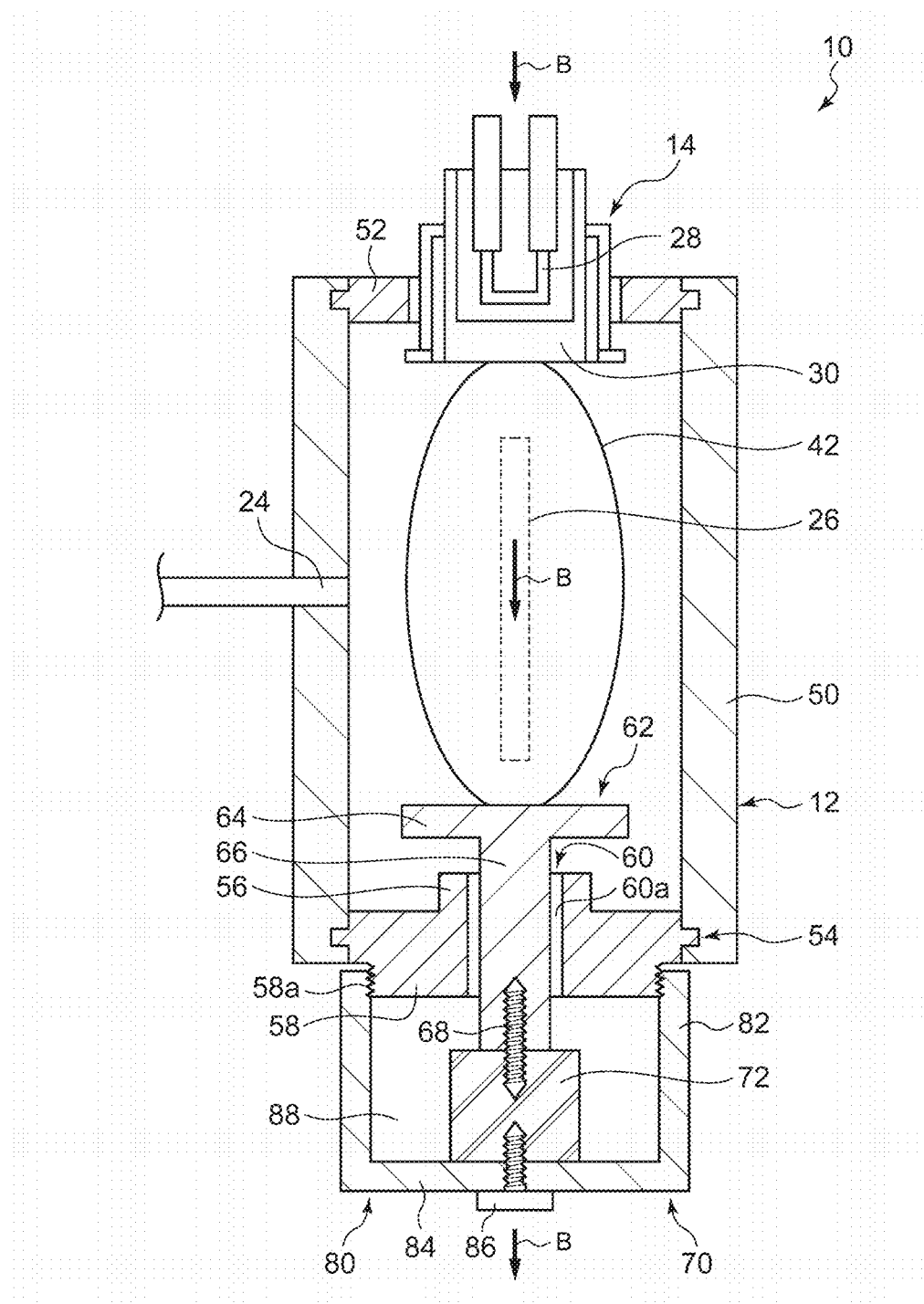
FIG. 4 is a schematic diagram that shows a supporting structure for a repeller in an ion generator according to a modification 1.

FIG. 4 is a schematic diagram that shows the supporting structure 70 for the repeller 62 in the ion generator 10 according to a modification 1. The modification 1 differs from the aforementioned embodiment in that the shield member covering the outer surfaces of the insulation member 72 is not provided. Since the insulation member 72 is disposed within the small chamber 88 also in the modification 1, an ionized substance is less likely to flow into the small chamber 88, and the insulation member 72 is maintained at a high temperature. Accordingly, the formation of a conductive film on a surface of the insulation member 72 is prevented, so that degradation of the insulation properties of the repeller 62 can be reduced. Also, since the supporting structure 70 is disposed coaxially, the positional accuracy of the repeller 62 can be improved.

Figure 5:
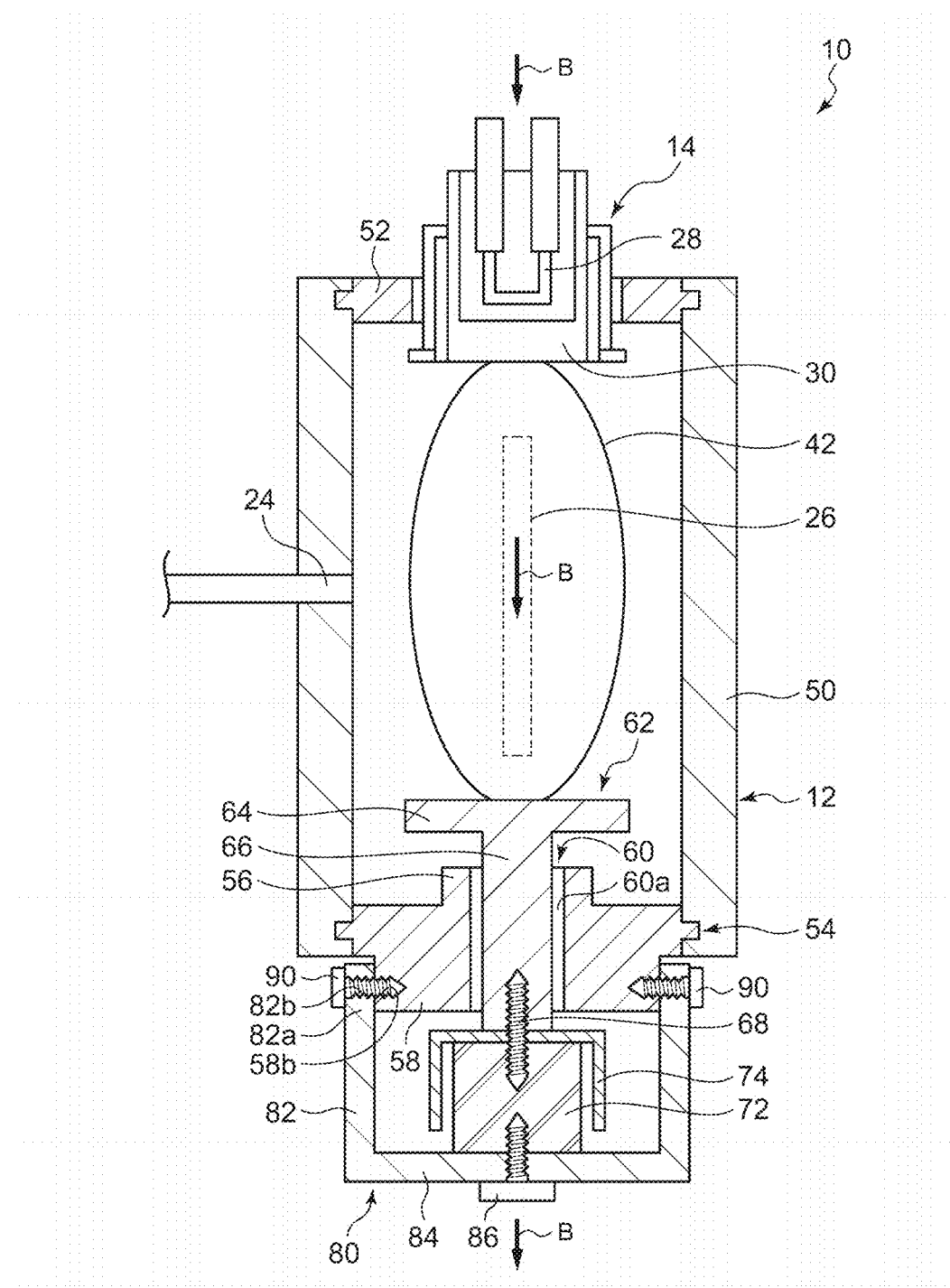
FIG. 5 is a schematic diagram that shows a supporting structure for a repeller in an ion generator according to a modification 2.

FIG. 5 is a schematic diagram that shows the supporting structure 70 for the repeller 62 in the ion generator 10 according to a modification 2. The modification 2 differs from the aforementioned embodiment in that, instead of the coaxial screw provided at the connection portion 58 of the lower surface plate 54, screw holes 58b are provided on the side surface of the connection portion 58 and the cover member 80 is fixed to the connection portion 58 by connection screws 90. Also, the open end 82a of the cover member 80 is provided with screw holes 82b, instead of being subjected to thread cutting, and the connection screws 90 are inserted through the screw holes 82b. Accordingly, the modification 2 provides the same effects as the aforementioned embodiment.

Figure 6:
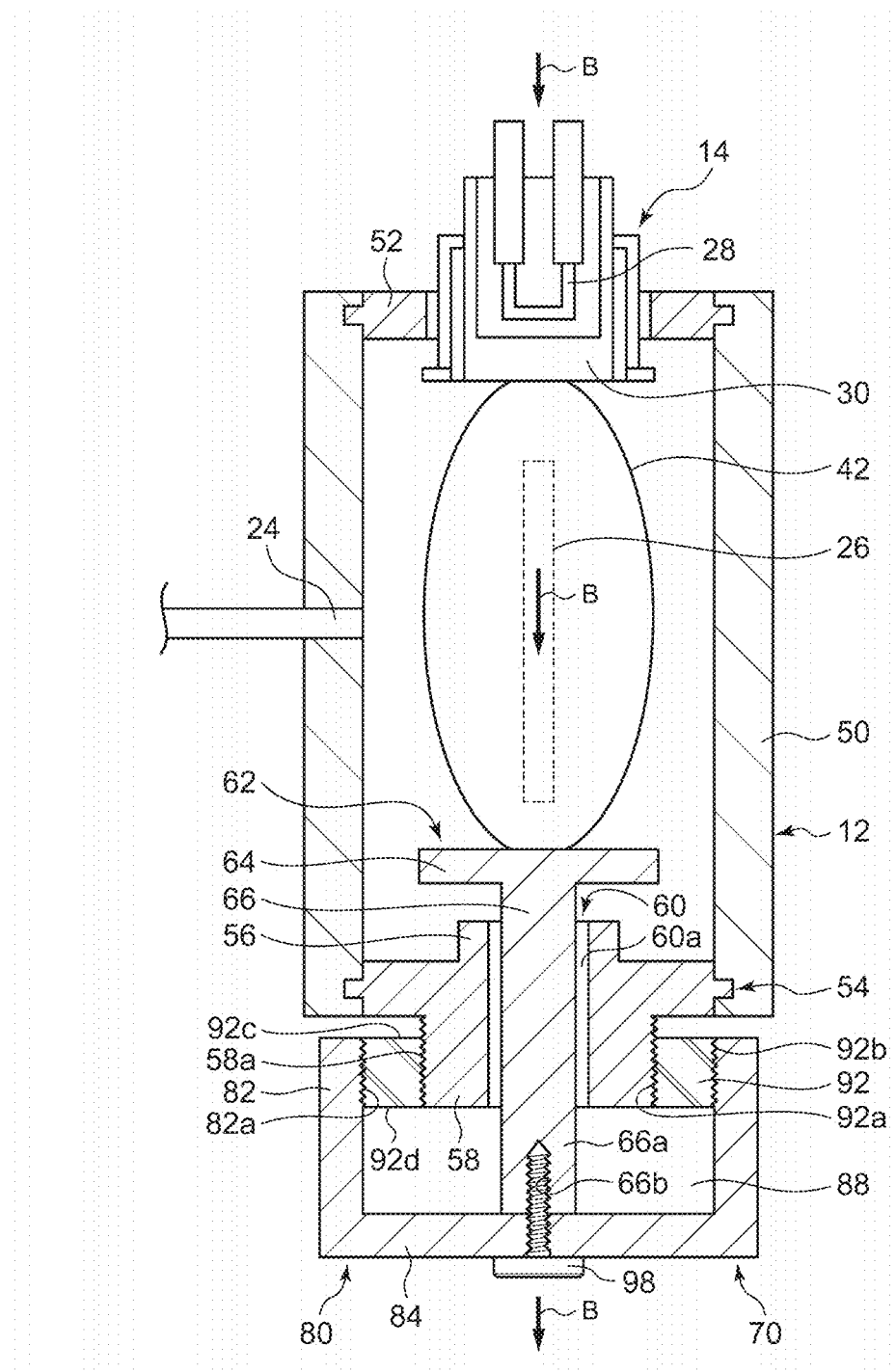
FIG. 6 is a schematic diagram that shows a supporting structure for a repeller in an ion generator according to a modification 3.

FIG. 6 is a schematic diagram that shows the supporting structure 70 for the repeller 62 in the ion generator 10 according to a modification 3. The modification 3 differs from the aforementioned embodiment in that an insulation member 92 is provided between the cover member 80 and the arc chamber 12 rather than between the repeller 62 and the cover member 80. In the following, the modification 3 will be described mainly for the differences from the embodiment.

The supporting structure 70 includes the cover member 80 and the insulation member 92. The cover member 80 has the side wall 82 of cylindrical shape and the bottom wall 84 attached thereto, forming a cup shape. The cover member 80, the connection portion 58, and the insulation member 92 form the small chamber 88, which is hermetically closed outside the arc chamber 12. Within the cover member 80, the end portion 66a of the repeller extension portion 66 is connected. The repeller extension portion 66 is fixed to the bottom wall 84 of the cover member 80 by a connection screw 98 disposed on the central axis of the through hole 60.

The insulation member 92 is a ring-shaped member, of which an inner wall 92a and an outer wall 92b are both subjected to thread cutting. The inner wall 92a is engaged with the coaxial screw 58a provided on the connection portion 58 of the lower surface plate 54, so that the insulation member 92 is fixed to the lower surface plate 54. Also, the outer wall 92b of the insulation member 92 is engaged with the inner surface of the open end 82a of the cover member 80, so that the insulation member 92 and the cover member 80 are connected. Thus, by providing the insulation member 92 between the lower surface plate 54 and the cover member 80, the repeller 62 can be insulated from the arc chamber 12.

Unlike the aforementioned embodiment, the modification 3 does not employ the structure in which the insulation member 72 is housed within the small chamber 88. However, since a gas is less likely to flow into the small chamber 88, as with in the aforementioned embodiment, the situation can be prevented where an ionized substance attaches to a lower surface 92d of the insulation member 92 facing to the small chamber 88 and a conductive film is formed. Also, since an upper surface 92c of the insulation member 92 facing to the outside of the arc chamber 12 is present outside the arc chamber 12, an ionized substance is less likely to attach thereto than to the inside of the arc chamber 12. Therefore, degradation of the insulation properties of the insulation member 92 can be restrained.

In the modification 3, since the insulation member 92 is directly connected to the lower surface plate 54, the insulation member 92 can be maintained at a high temperature. Accordingly, the formation of a conductive film on a surface of the insulation member 92 can be prevented.

Further, since the through hole 60, repeller 62, cover member 80, and insulation member 92 are disposed coaxially also in the modification 3, the repeller 62 is less likely to shift in position in a direction intersecting the axis, even when the connection portions of such components become loose. Accordingly, the gap 60a between the repeller extension portion 66 and the inner wall of the through hole 60 can be maintained.

The present invention has been described with reference to the aforementioned embodiment. However, the present invention is not limited thereto and also includes a form resulting from appropriate combination or replacement of the configurations in the embodiment. It is also to be understood that appropriate changes of the combination or the order of processes in the embodiment or various modifications, including design modifications, may be made based on the knowledge of those skilled in the art and that such changes and modifications also fall within the scope of the present invention.

The aforementioned embodiment and modifications describe the supporting structure 70 in which the small chamber 88 is hermetically closed. However, in a further modification, the small chamber 88 need not be hermetically closed in a strict sense, and the airtightness of the small chamber 88 may be decreased a little because of a gap caused by a screw hole or the like provided in the supporting structure 70. In this case, since a little part of the source gas within the arc chamber 12 flows into the small chamber 88 through the gap 60a in the through hole 60 and then flows out of the arc chamber 12 through the gap caused by a screw hole or the like, there is generated a little flow of gas from the arc chamber 12 to the small chamber 88. However, compared to the case in which the small chamber 88 is not formed by the supporting structure 70, the amount of ionized substances flowing into the small chamber 88 can be reduced. Therefore, even when the small chamber 88 is not hermetically closed in a strict sense, degradation of the insulation properties of the insulation member 72 provided in the supporting structure 70 can be reduced.

The aforementioned embodiment and modifications describe the case in which a connection screw is used as a connection member for fixing the repeller extension portion 66 to the supporting structure 70. In a further modification, a connection member other than a screw may be used. For example, a bolt or a combination of a bolt and a nut may be used as a connection member for the fixing.

It should be understood that the invention is not limited to the above-described embodiment, but may be modified into various forms on the basis of the spirit of the invention. Additionally, the modifications are included in the scope of the invention. Priority is claimed to Japanese Patent Application No. 2013-267764, filed on Dec. 25, 2013, the entire content of which is incorporated herein by reference.

What is claimed is:

1. An ion generator, comprising:
   an arc chamber;
   a repeller that includes a repeller plate provided within the arc chamber and a repeller extension portion inserted through a through hole communicating the inside and the outside of the arc chamber; and
   a supporting structure that is provided outside the arc chamber and that supports the repeller so that a gap is ensured between the repeller extension portion and an inner wall of the through hole, the supporting structure including a cover member that forms, outside the arc chamber, a small chamber communicating with the gap, and an insulation member that electrically insulates the arc chamber and the repeller from each other.

2. The ion generator of claim 1, wherein the small chamber is hermetically closed outside the arc chamber.

3. The ion generator of claim 1, wherein the insulation member is provided within the small chamber and connects the repeller extension portion and the cover member.

4. The ion generator of claim 3, wherein the supporting structure further includes a shield member that is provided between the repeller extension portion and the insulation member and provided so as to cover an outer surface of the insulation member.

5. The ion generator of claim 1, wherein the cover member is attached to the outside of the arc chamber through the insulation member.

6. The ion generator of claim 1, wherein the repeller extension portion is fixed to the supporting structure by a connection member provided coaxially with the central axis of the through hole.

7. The ion generator of claim 1, wherein:
   the arc chamber has a threaded structure provided on the outside thereof and coaxially with the central axis of the through hole; and
   the supporting structure is fixed to the arc chamber by being screwed onto the threaded structure.

8. A supporting structure for supporting a base of a repeller inserted through a through hole communicating the inside and the outside of an arc chamber so that a gap is ensured between the base and an inner wall of the through hole, the supporting structure comprising a cover member that forms, outside the arc chamber, a small chamber communicating with the gap, and an insulation member that electrically insulates the arc chamber and the repeller from each other.

* * * * *

UNITED STATES PATENT AND TRADEMARK OFFICE
CERTIFICATE OF CORRECTION

| | |
|---|---|
| PATENT NO. | : 9,153,406 B2 |
| APPLICATION NO. | : 14/582696 |
| DATED | : October 6, 2015 |
| INVENTOR(S) | : Masateru Sato |

It is certified that error appears in the above-identified patent and that said Letters Patent is hereby corrected as shown below:

On the title page item 73 please replace "SEN CORPORATION" with -- Sumitomo Heavy Industries Ion Technology Co, Ltd. --

Signed and Sealed this
Twenty-fourth Day of May, 2016

Michelle K. Lee
*Director of the United States Patent and Trademark Office*